(12) United States Patent
Leobandung

(10) Patent No.: US 10,446,490 B2
(45) Date of Patent: Oct. 15, 2019

(54) JUNCTIONLESS BACK END OF THE LINE VIA CONTACT

(71) Applicant: INTERNATIONAL BUSINESS MACHINES CORPORATION, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 21 days.

(21) Appl. No.: 15/292,789

(22) Filed: Oct. 13, 2016

(65) Prior Publication Data

US 2017/0194256 A1 Jul. 6, 2017

Related U.S. Application Data

(62) Division of application No. 14/983,643, filed on Dec. 30, 2015, now Pat. No. 9,536,832.

(51) Int. Cl.
*H01L 23/48* (2006.01)
*H01L 23/52* (2006.01)
*H01L 29/40* (2006.01)
*H01L 23/528* (2006.01)
*H01L 21/3213* (2006.01)
(Continued)

(52) U.S. Cl.
CPC .... *H01L 23/5283* (2013.01); *H01L 21/32134* (2013.01); *H01L 21/76804* (2013.01); *H01L 21/76805* (2013.01); *H01L 21/76844* (2013.01); *H01L 23/5226* (2013.01); *H01L 23/53238* (2013.01); *H01L 23/53295* (2013.01); *H01L 23/53223* (2013.01); *H01L 23/53266* (2013.01)

(58) Field of Classification Search
CPC .......... H01L 21/76843; H01L 23/5226; H01L 23/53295
USPC .................................................. 257/750, 758
See application file for complete search history.

(56) References Cited

U.S. PATENT DOCUMENTS 7,749,892 B2* 7/2010 Bonilla ............. H01L 21/76825
438/622
2010/0006850 A1* 1/2010 Tyberg ................ H01L 23/5226
257/66

(Continued)

OTHER PUBLICATIONS

List of IBM Related Patents or Patent Applications Treated as Related; (Appendix P), Date filed Nov. 3, 2016, two pages.

(Continued)

*Primary Examiner* — S. V. Clark
(74) *Attorney, Agent, or Firm* — Cantor Colburn LLP; JoAnn Crockatt

(57) ABSTRACT

A method of forming an interconnect structure includes providing a first dielectric layer, patterning a wire opening in a first dielectric layer, lining the wire opening with a metal liner and includes filling the wire opening with a first conductive material. The method also includes depositing a first cap on the first dielectric layer, depositing a second dielectric layer, and patterning a via trench in the second dielectric layer. The method also includes depositing a metal liner, removing the metal liner from a via junction, and enlarging the contact area. The method also includes filling the via trench with a second conductive material to form a via.

17 Claims, 10 Drawing Sheets

(51) Int. Cl.
*H01L 23/522* (2006.01)
*H01L 23/532* (2006.01)
*H01L 21/768* (2006.01)

(56) References Cited

U.S. PATENT DOCUMENTS

| | | | | |
|---|---|---|---|---|
| 2010/0308464 A1* | 12/2010 | Tsutsue | ............... | H01L 23/564 |
| | | | | 257/758 |
| 2011/0049719 A1* | 3/2011 | Oda | ............... | H01L 21/76808 |
| | | | | 257/758 |
| 2011/0266679 A1* | 11/2011 | Hotta | ............... | H01L 23/585 |
| | | | | 257/758 |
| 2011/0272812 A1* | 11/2011 | Horak | ............... | H01L 21/76805 |
| | | | | 257/758 |
| 2015/0235946 A1* | 8/2015 | Bonilla | ............... | H01L 23/5226 |
| | | | | 257/758 |

OTHER PUBLICATIONS

U.S. Appl. No. 14/983,643, filed Dec. 30, 2015, Entitled: "Junctionless back end of the line via contact".

* cited by examiner

JUNCTIONLESS BACK END OF THE LINE VIA CONTACT

DOMESTIC PRIORITY

This application is a Divisional of and claims priority to U.S. patent application Ser. No. 14/983,643 filed Dec. 30, 2015 entitled "JUNCTIONLESS BACK END OF THE LINE VIA CONTACT," the contents of which in its entirety are incorporated by reference.

BACKGROUND

The present invention relates to back end of the line contacts for semiconductor devices, and more specifically, to junctionless back end of the line via contacts.

An integrated circuit (IC) device may be formed with millions of transistors and other circuit elements that are fabricated on a single silicon crystal substrate (wafer). For the IC device to be functional, multi-level or multi-layered interconnection schemes such as, for example, dual damascene wiring (interconnect structures) or wiring formed by subtractive etch, are fabricated using BEOL (back end of line) techniques to connect the circuit elements distributed on the surface of the device. BEOL technologies must be continuously optimized through changes in process flows and material used in order to build high performance structures as critical dimensions decrease. For example, etching of small profiles using thin masking layers becomes increasingly problematic with regard to etch profile control (controlling shape of hole or trench being formed) or control of etching damage and residues. Maximizing metal volume for a given space is difficult with current technologies.

SUMMARY

According to one embodiment, a method of forming an interconnect structure, includes providing a first dielectric layer. The method also includes patterning a wire opening in a first dielectric layer. The method also includes lining the wire opening with a metal liner. The method also includes filling the wire opening with a first conductive material. The method also includes depositing a first cap on the first dielectric layer to form a first device layer, the first device layer comprising the first dielectric layer and the first cap. The method also includes depositing a second dielectric layer on the first device layer. The method also includes patterning a via trench in the second dielectric layer, wherein the via trench includes a via junction at the top of the second conductive material. The method also includes depositing a metal liner. The method also includes removing the metal liner from a via junction. The method also includes enlarging the contact area. The method also includes filling the via trench with a second conductive material to form a via.

According to another embodiment, a method of forming an interconnect structure includes depositing an interlayer dielectric on a bottom interconnect layer, the bottom interconnect layer comprising a bottom dielectric layer and a first material. The method also includes patterning a trench in the interlayer dielectric, the trench extending through the interlayer dielectric to the top of the first material. The method also includes depositing a metal liner on the patterned interlayer dielectric. The method also includes anisotropically etching the liner to remove the liner from the bottom of the trench. The method also includes isotropically etching the structure to remove a portion of the first material. The method also includes depositing a second material to fill the trench.

According to yet another embodiment, an interconnect structure includes a bottom layer. The bottom layer includes a dielectric material, a first conductive material patterned in the bottom dielectric material, and a first cap. The interconnect structure also includes an upper layer. The upper layer includes an interlayer dielectric material, a second conductive material patterned in the interlayer dielectric material, and a second cap. According to an embodiment, the first conductive material contacts the second conductive material at a via junction.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 4A-4G illustrate a method of fabricating an interconnect structure in accordance with an embodiment of the disclosure, in which:

FIG. 4A illustrates a structure after a first dielectric layer is provided in a bottom layer, capped and patterned with a metal liner and conductive material in accordance with an embodiment of the disclosure;

FIG. 4B illustrates the structure after a second dielectric layer and second cap are deposited and a via opening and wire trench are patterned in accordance with an embodiment of the disclosure;

FIG. 4C illustrates the structure after a second liner is deposited in accordance with an embodiment of the disclosure;

FIG. 4D illustrates the structure after anisotropically etching the second liner from the bottom of the via opening in accordance with an embodiment of the disclosure;

FIG. 4E illustrates the structure after anisotropically etching the second liner in accordance with an embodiment of the disclosure;

FIG. 4F illustrates the structure after filling the via opening and wire opening with a conductive material in accordance with an embodiment of the disclosure; and FIG. 4G illustrates the structure after planarizing the conductive material and liner in accordance with an embodiment of the disclosure.

DETAILED DESCRIPTION

The disclosure relates to issues pertaining to interconnect scaling in BEOL techniques. Interconnect structures in BEOL technologies can be formed by damascene processes. In some cases an opening in the interconnect level may be a via, extending perpendicular to the surface of IC completely through the interlayer dielectric (ILD) for connecting an overlying wire of a higher wiring level or of the present wiring level to an underlying wire of a lower wiring level. A filled via is typically simply referred to as a via or as a plug when connecting to an underlying first metallization (M1) or to an element of an underlying MOS (metal oxide semiconductor) structure. A filled via can have a metal fill and also a barrier layer separating the metal from the ILD. The barrier layer in conventional devices is a metal layer that can prevent diffusion of the metal fill into the ILD. In conventional BEOL interconnect manufacture techniques, a lower metal fill can be provided before an upper level metal fill to form the via. Before the upper level is filled to form a via, a new metal liner is deposited on the device. The resultant via, in conventional processes, can have a metal liner at a junction between the upper level and the lower level. The metal fill and the barrier layer can have different contact resistances. Such differing contact resistances are undesirable in interconnect devices and are particularly undesirable in the relatively small areas in via junctions.

Figure 1:
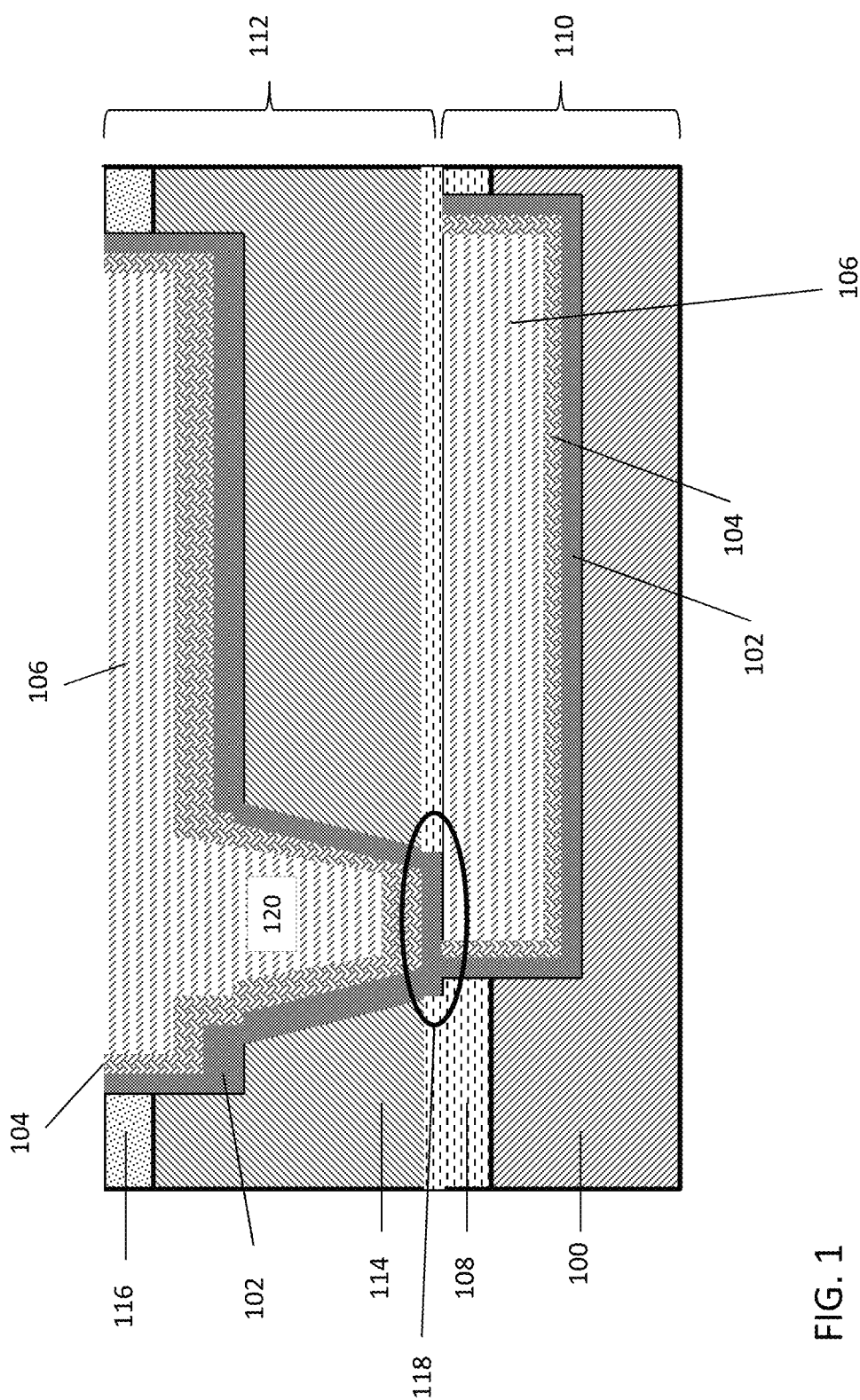
FIG. 1 depicts a cross sectional side view of an exemplary conventional device with interconnect structures defining metal wiring

FIG. 1 illustrates an exemplary interconnect structure formed with conventional methods. A bottom dielectric 100, for example a dielectric layer with a low dielectric constant (k), is provided and a metal liner 102 is deposited in the bottom dielectric. Metal liner 102 can be a barrier layer composed of metal, such as tantalum (Ta) or tantalum nitride (TaN). In some cases, a copper seed layer 104, for example, can be deposited on the metal liner 102. A metal fill 106 is then deposited. The metal fill 106 can be polished, for example with CMP, before forming the upper layer 112 of the interconnect structure. A first cap 108 can be provided to separate a bottom layer 110 from an upper layer 112.

The upper layer 112 of the exemplary conventional structure shown in FIG. 1 contains an interlayer dielectric 114, which can be deposited on top of the first cap 108 and metal fill 106 of the bottom layer 110. The interlayer dielectric 114 can be patterned to form a trench that will form a junction 118 in the via 120. After patterning, a metal liner 102 is deposited on the device. Then, a copper seed layer 104 may be added and the upper layer is filled with a metal fill 106. The upper layer 112 can include an upper layer cap 116 covering the interlayer dielectric 114 and can be polished to remove the metal fill 106 from above the structure. At the junction 118, conventionally manufactured vias contain a portion of the metal liner 102 between the metal fill 106 of the bottom layer 110 and the metal fill 106 of the upper layer 112. The metal liner 102 can have a higher resistance than the metal fill 106. The differing resistances are undesirable, particularly as industry demands and design constraints call for smaller structures with junctions having small contact areas. Moreover, the resultant contact area between the upper layer and the bottom layer is undesirably reduced by the metal liner at the junction.

Accordingly, the present disclosure provides BEOL interconnect structures that have reduced resistance in the lower via. Moreover, the present disclosure can increase the metal fill contact area between upper layers and lower layers in multi-layered interconnect structures.

Figure 2:
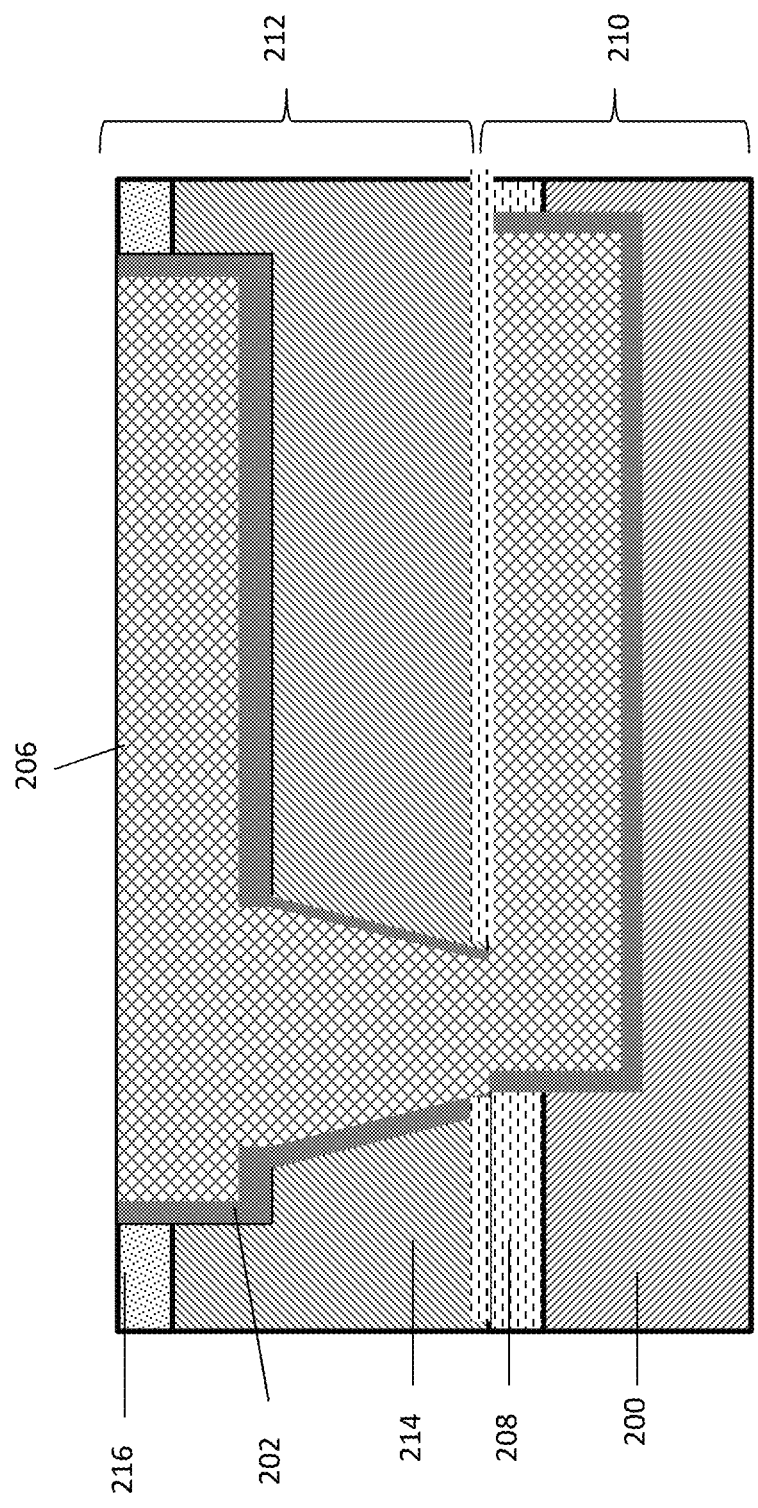
FIG. 2 depicts a cross sectional side view of an exemplary device with interconnect structures defining metal wiring according to one embodiment of the disclosure.

FIG. 2 illustrates and exemplary interconnect structure according to one embodiment of the disclosure. The exemplary interconnect structure includes a first layer 210 and a second layer 212. The first layer 210 contains a first dielectric layer 200. First dielectric layer 200 can be capped with a first cap 208, separating the first dielectric layer 200 from the second layer 212. The second layer includes a second dielectric layer 214, which is patterned with a trench extending to the bottom layer 210 that is filled with conductive material 206 and lined with liner 202. In an embodiment, as illustrated, there is no liner separating the conductive material 206 of the first layer and the second layer. The exemplary structure includes a trench that is lined with a metal liner 202 and filled with a conductive material 206. A second cap 216 can be deposited on top of the second dielectric layer 214.

The dielectric layers can include any suitable dielectric material used in interconnect structures and can be the same or different. In some embodiments, the dielectric layer has a dielectric constant less than or equal to four. The dielectric layer can be a single layer or, more preferably, is a composite of several layers including adhesion layers or etch stop layers. For example, the dielectric layer 206 can include a silicon dioxide or a doped silicon dioxide. The dielectric layer 206 can include several layers having different carbon contents; the dielectric layer 206 can include a nitrogen containing layer; the dielectric layer 206 can include a porous layer; the dielectric layer 206 can includes a spin on glass, e.g. SiLK.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

Any suitable metal liner 202 can be used. Typical liner materials include tantalum (Ta), tantalum nitride (TaN), titanium (Ti), titanium nitride (TiN), tungsten (W), ruthenium (Ru) and ruthenium nitride (RuN).

Conductive material 206 is a conductive material that is suitable for conductors, conductive vias, and conductive wire. Conductive material 206 can be a conductive metal, such as tungsten (W), copper (Cu), or aluminum (Al) and alloys thereof.

The first cap 208 and second cap 216 can form a dielectric barrier. In a multi-layered device, such as the device shown in FIG. 2, the material used for the first cap 208 and the second cap 216 can be the same or different. Dielectric materials that can be used for the caps include any now known or later developed dielectric layer such a silicon carbide (SiC), silicon nitride ($Si_3N_4$), silicon dioxide ($SiO_2$), and nitrogen or hydrogen doped silicon carbide (SiC(N,H)).

Although FIG. 2 depicts a two layered structure, in some embodiments, interconnect structures have more than two layers, such as three layers, four layers, five layers, or ten layers. The number of layers is not limited in accordance with the disclosure.

Figure 3:
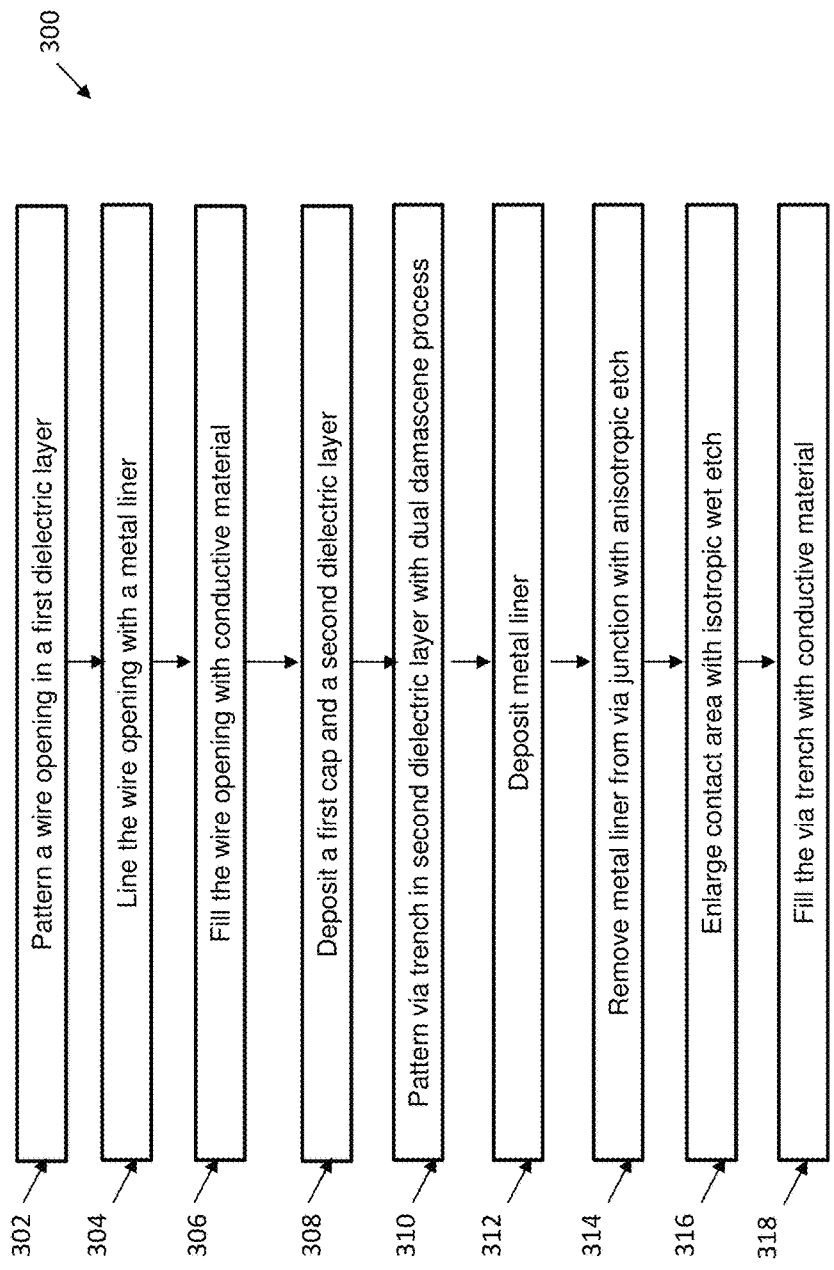
FIG. 3 is a flow diagram of a method for fabricating an interconnect structure in accordance with an embodiment of the disclosure.

FIG. 3 is a flow chart of a method 300 for forming an interconnect structure according to one exemplary embodiment. In accordance with the method 300, as shown at block 302, a wire opening is patterned in a first dielectric layer. Then, as shown at block 304, the method 300 includes lining the wire opening with a metal liner. Next, the method 300 includes filling the wire opening with conductive material as shown at block 306. Then, as shown at block 308, a first cap and second dielectric layer are deposited. Next, the method 300 includes patterning a via trench in the second dielectric layer with a dual damascene process, as shown at block 310. As shown at block 312, the method 300 next includes depositing a metal liner. The method 300 also includes removing the metal liner from the via junction by anisotropically etching the device as shown at block 314. Then, as shown at block 316, the method 300 includes enlarging the contact area between the first and second layer of the structure with an isotropic wet etch. Then, as shown at block 318, the via trench is filled with conductive material.

Figure 4A:
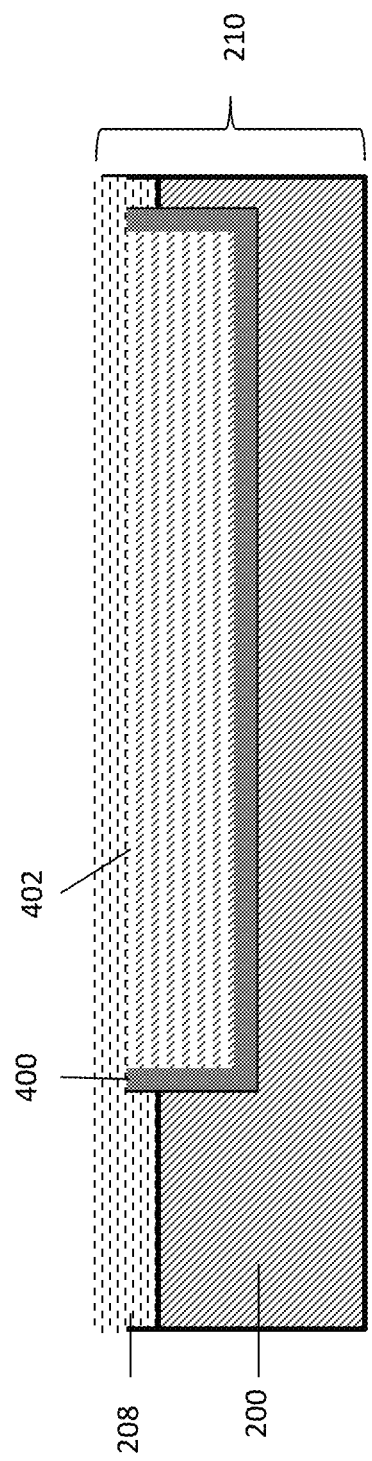

FIGS. 4A-4G illustrate a method of forming an interconnect structure according to an embodiment of the disclosure. As shown in FIG. 4A, a first dielectric layer 200 is provided in a bottom layer 210 of the structure. The first dielectric layer 200 is capped with a first cap 208. The bottom layer 210 also includes a first metal liner 400 and a first conductive material 402 patterned in the first dielectric layer 200. In some embodiments, the first cap 208 includes two layers, one above the conductive material 402 and first metal liner, and one layer below. The cap material of the two layers can be the same or different. Preferably, the cap material above the conductive material 402 and first metal liner 400 is different than the cap material of the layer below. Using different materials in this step can allow selective etching in a later processing step, for example to cap material below.

Figure 4B:
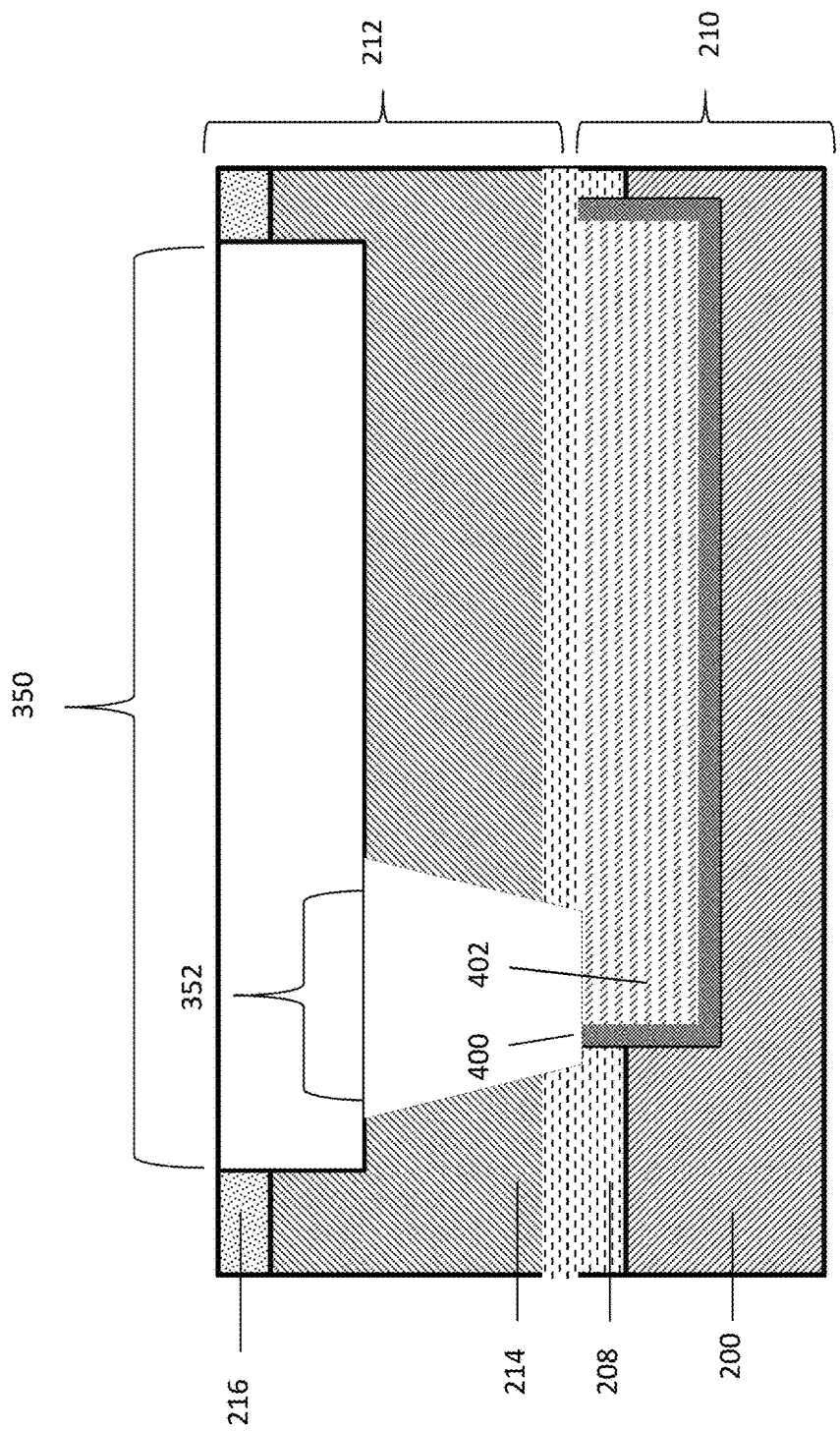

Next, as shown in FIG. 4B, a second layer 212 is formed, including a second dielectric layer 214 deposited on the bottom layer 210. The second dielectric layer 214 can be the same material of as the first dielectric layer 200 or can be a different material. A second cap 216 is deposited on the second dielectric layer 214. The second cap 216 can be the same material as the first cap 208 or can be a different material. A trench, including a wire trench 350 and a via opening 352 are patterned with standard processes, including, for example, photolithography and etching. In some embodiments, the via opening 352 can be patterned with a dual damascene process.

Figure 4C:
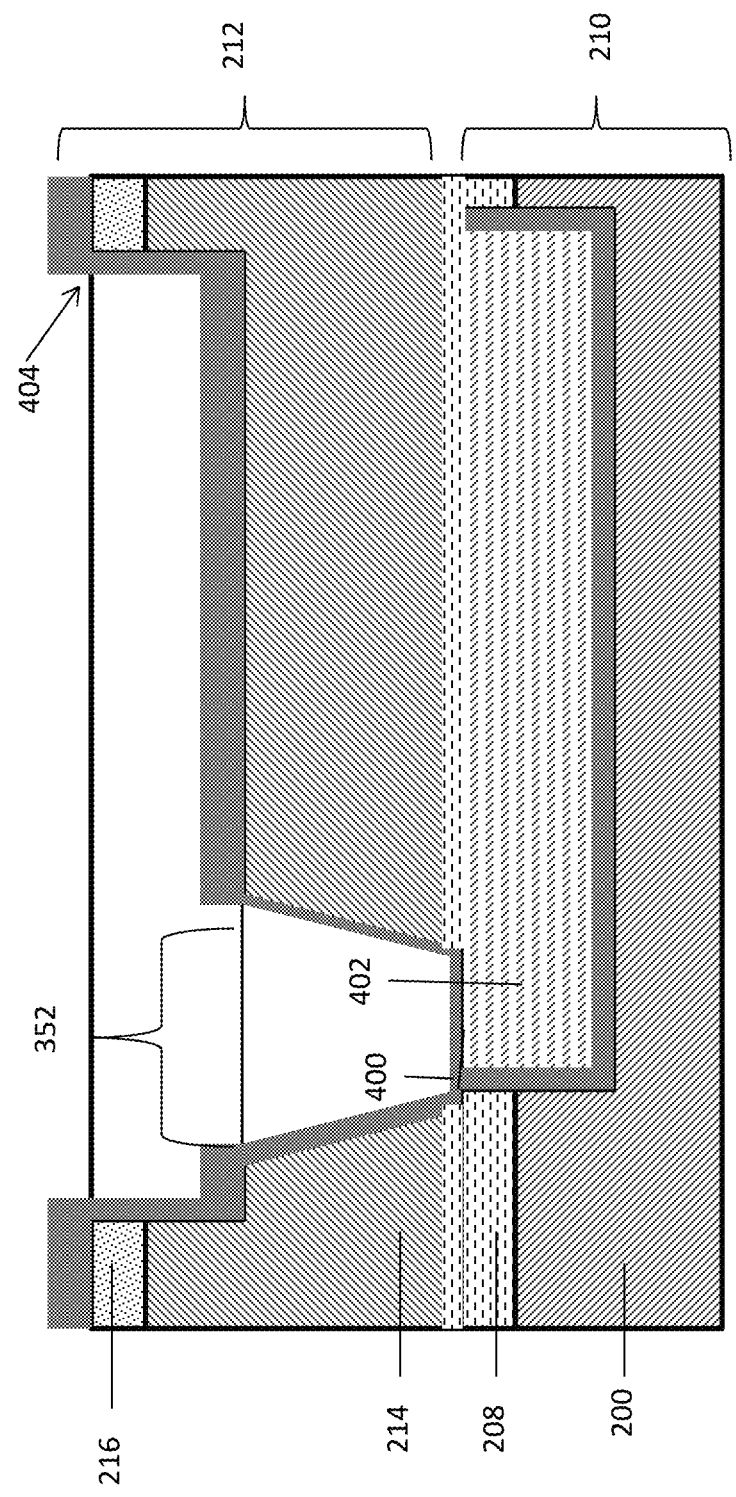

FIG. 4C illustrates the structure with a second liner 404 deposited on the structure. The second liner 404 can be a metal liner in some embodiments and can be the same material or a different material than the first liner 208. Preferably, the second liner 404 is the same material as the first liner 208. The second liner 404 can be a non-conformal liner of varying widths. For example, the aspect ratio of the structure when the second liner 404 is deposited can result in a thicker second liner 404 on the horizontal surfaces and a thinner second liner 404 on the walls and bottom of the via opening 352.

Figure 4D:
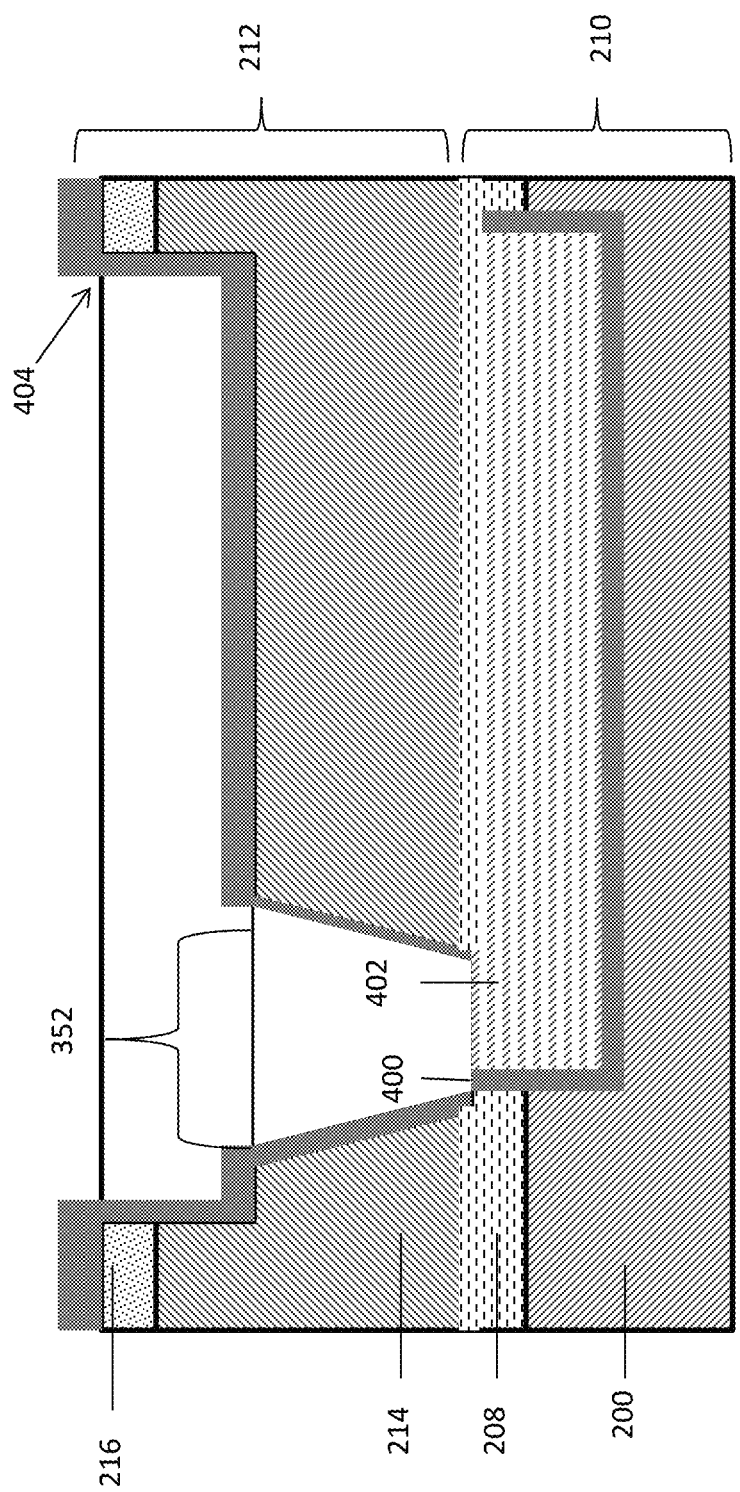

FIG. 4D illustrates the structure after anistropically etching the second liner 404. An anisotropic etch can remove all of the second liner 404 from the bottom of the via opening 352 exposing the first conductive material 402 while retaining the second liner on the horizontal surfaces and the walls of the via, where the second liner 404 was thicker due to the aspect ratio of the structure.

Figure 4E:
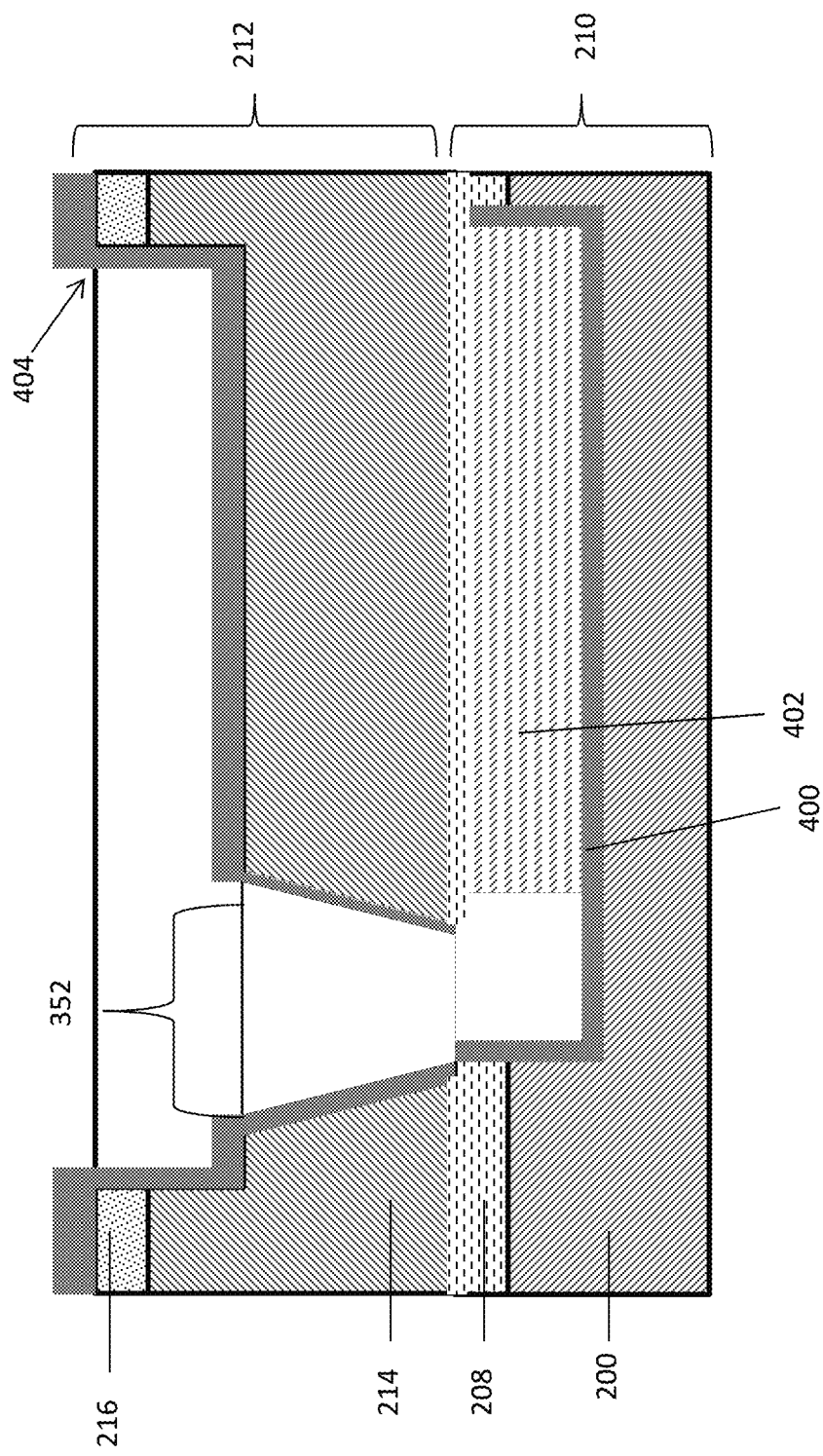

As illustrated in FIG. 4E, an isotropic etch can be performed in some embodiments. An isotropic etch can remove first conductive material 402 that might have been damaged during the anisotropic etch and undercuts the first conductive material 402. The contact area in the via opening 352 can be enlarged. As used herein, contact area means the area at the bottom of the via opening where conductive material of the upper layer 212 meets conductive material of the bottom layer 210 in the finished structure.

Figure 4F:
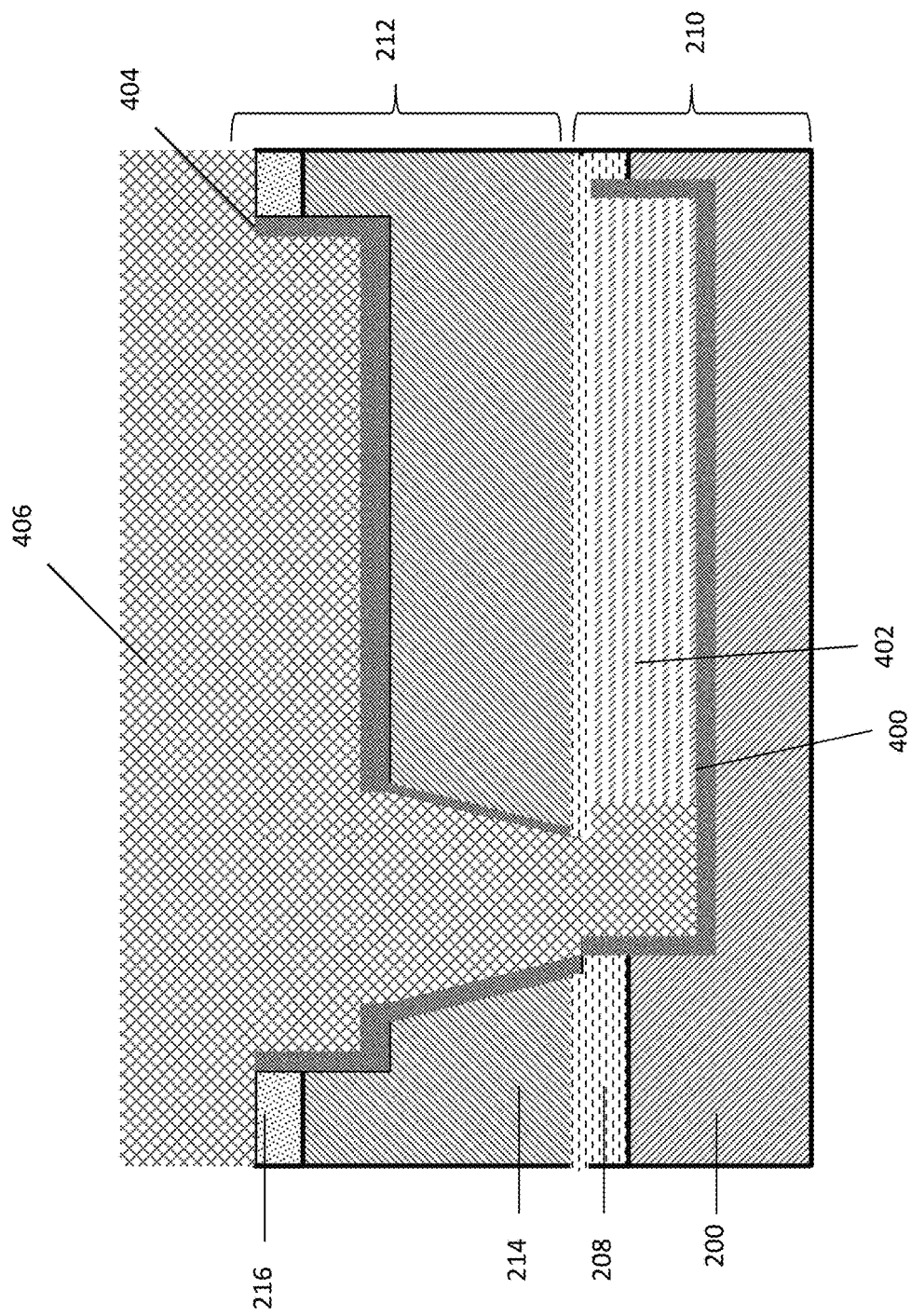

FIG. 4F illustrates an exemplary structure according to an embodiment after filling the via opening and wire opening with a second conductive material 406. Second conductive material 406 can be the same or different than the first conductive material 402. Preferably, the first conductive material 402 and the second conductive material 406 are the same material. The second conductive material 406 and the first conductive material, in some embodiments, are both copper. In some embodiments, the structure does not include a metal seed layer. For example, in some embodiments, the second conductive material 406 is seeded from the first conductive material 402.

Figure 4G:
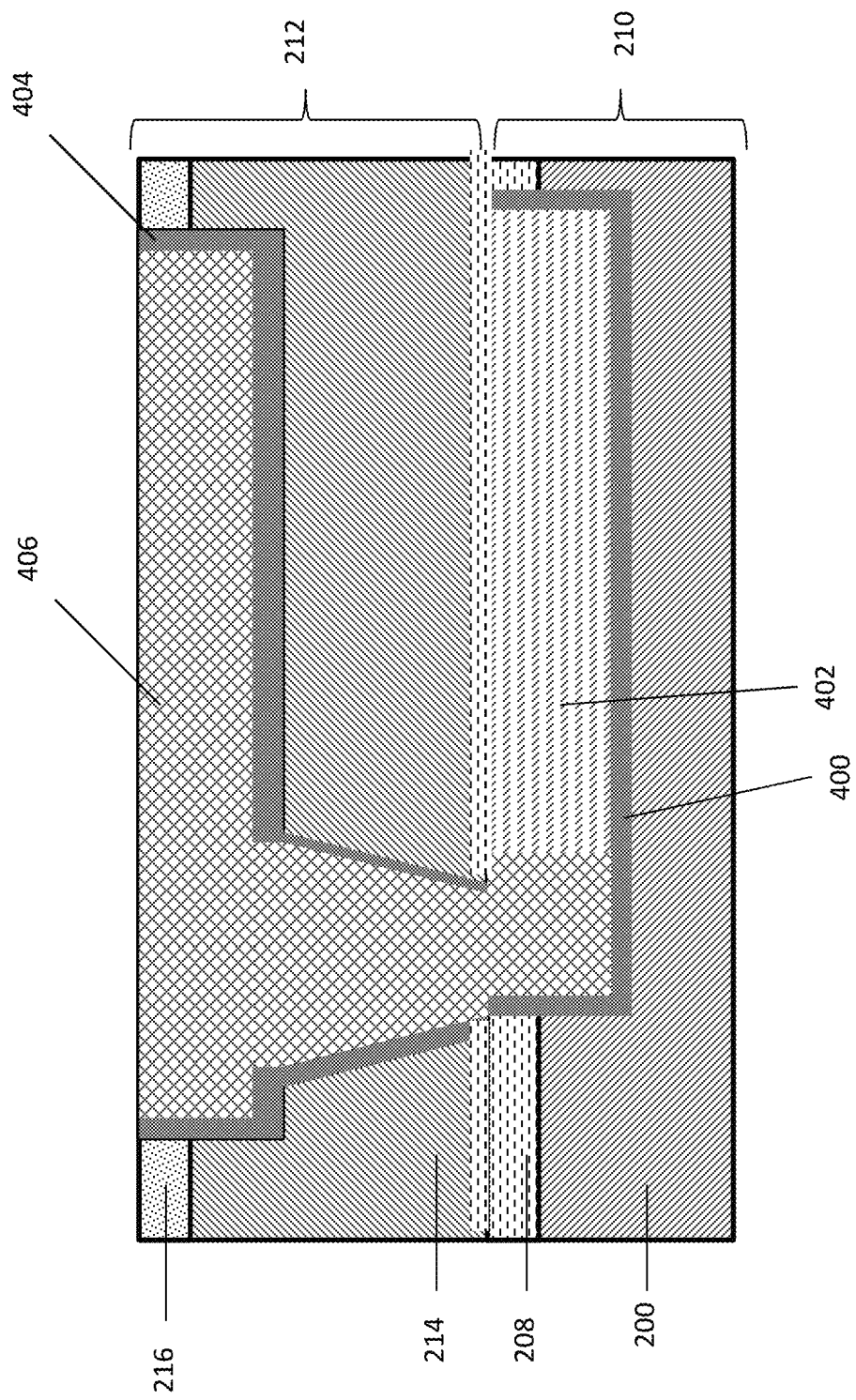

FIG. 4G illustrates the exemplary structure after planarizing the second conductive material 406 and liner 404 to the top of the second cap 216. In some embodiments, planarizing includes CMP.

Any suitable metal liner can be used for the first and second liner 400 and 404. Typical liner materials include tantalum (Ta), tantalum nitride (TaN), titanium (Ti), titanium nitride (TiN), tungsten (W), ruthenium (Ru) and ruthenium nitride (RuN). Preferably, the first and second liner 400 and 404 are the same material.

First and second conductive material 402 and 406 is a material that is suitable for conductors, conductive vias, and conductive wire and can be a conductive metal, such as tungsten (W), copper (Cu), or aluminum (Al) and alloys thereof. Preferably, first and second conductive material comprise copper.

Structures formed in accordance with the disclosure can include a continuous layer of conductive material connecting a bottom layer to an upper layer. For example, a via and one or more wire structures can be formed of one continuous layer of copper.

In some embodiments, structures formed in accordance with the disclosure can have an enlarged contact opening. An enlarged contact opening can be advantageous during manufacture, for example, because it may provide greater tolerance for misalignment.

In some embodiments, structures formed in accordance with the disclosure can have reduced resistance on the stack via in comparison with conventional interconnect structures.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. An interconnect structure comprising:
a bottom layer, the bottom layer comprising:
a dielectric material,
a first conductive material patterned in a first trench in the bottom dielectric material, and
a first cap comprised of two layers, wherein a first layer of the two layers is formed on the dielectric material and a second layer of the two layers is formed on the first conductive material and the first layer; and
an upper layer, the upper layer comprising:
an interlayer dielectric material,
a second conductive material patterned in a second trench in the interlayer dielectric material,
a metal liner patterned along the sidewalls of the second trench, and
a second cap,
wherein a sidewall of the first conductive material is recessed from a bottom surface of the second trench; and
wherein an interface where the recessed sidewall of the first conductive material directly contacts the second conductive material is within the first trench.

2. The interconnect structure of claim 1, wherein the first conductive material and the second conductive material are the same material.

3. The interconnect structure of claim 2, wherein the first conductive material and the second conductive material are copper.

4. The interconnect structure of claim 1, wherein the metal liner is positioned between the first conductive material and the dielectric material and between the second conductive material and the interlayer dielectric material.

5. The interconnect structure of claim 1, wherein the dielectric layer has a dielectric constant less than or equal to four.

6. The interconnect structure of claim 1, wherein the dielectric layer is a composite layer.

7. The interconnect structure of claim 1, wherein the dielectric layer comprises silicon dioxide.

8. The interconnect structure of claim 1, wherein the dielectric layer comprises a porous layer.

9. The interconnect structure of claim 1, wherein the dielectric layer comprises spin on glass.

10. The interconnect structure of claim 1, wherein the metal liner comprises a material selected from the group consisting of tantalum, tantalum nitride, titanium, titanium nitride, tungsten, ruthenium, and ruthenium nitride.

11. The interconnect structure of claim 1, wherein the conductive material comprises a conductive metal selected from the group consisting of tungsten, copper, aluminum, and alloys thereof.

12. The interconnect structure of claim 1, wherein the first cap and second cap form a dielectric barrier.

13. The interconnect structure of claim 1, wherein the first cap or second cap comprise silicon carbide, silicon nitride, silicon dioxide, or nitrogen or hydrogen doped silicon carbide.

14. The interconnect structure of claim 1, wherein the interconnect structure has four layers.

15. The interconnect structure of claim 3, wherein the first conductive material and the second conductive material form a continuous layer of copper.

16. The interconnect structure of claim 1, wherein the first cap and the second cap comprise different materials.

17. The interconnect structure of claim 1, wherein the second layer of the two layers is formed on the metal liner.

* * * * *